(12) United States Patent
Kadota (10) Patent No.: US 6,663,943 B2
(45) Date of Patent: Dec. 16, 2003

(54) SURFACE ACOUSTIC WAVE DEVICE AND METHOD FOR MAKING THE SAME

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/884,276

(22) Filed: Jun. 19, 2001

(65) Prior Publication Data

US 2001/0055668 A1 Dec. 27, 2001

(30) Foreign Application Priority Data

Jun. 27, 2000 (JP) ........................................ 2000-193297

(51) Int. Cl.[7] .............................. B32B 3/00; B32B 3/30; B32B 7/02; H01L 23/28; H01L 23/29
(52) U.S. Cl. ....................... 428/156; 428/163; 428/195; 428/212; 428/217; 310/313 R; 310/348; 257/787; 257/788; 257/789; 257/790; 257/791; 257/792; 257/795; 257/793; 257/794
(58) Field of Search ................................ 428/156, 163, 428/195, 212, 217; 310/313 R, 348; 257/787–796

(56) References Cited

U.S. PATENT DOCUMENTS

| | | | | |
|---|---|---|---|---|
| 4,163,072 A | * | 7/1979 | Soos | 427/96 |
| 5,215,801 A | * | 6/1993 | Wong | 428/76 |
| 5,227,219 A | * | 7/1993 | Bayer et al. | 428/156 |
| 5,260,913 A | * | 11/1993 | Kadota et al. | 367/140 |
| 5,390,401 A | * | 2/1995 | Shikata et al. | 29/25.35 |
| 5,712,523 A | * | 1/1998 | Nakashima et al. | 310/313 R |
| 5,900,581 A | * | 5/1999 | Ootake | 174/52.2 |
| 5,998,907 A | * | 12/1999 | Taguchi et al. | 310/313 R |
| 6,236,141 B1 | * | 5/2001 | Sato et al. | 310/313 R |
| 6,281,436 B1 | * | 8/2001 | Gotoh et al. | 174/52.3 |
| 6,310,421 B2 | * | 10/2001 | Morishima | 310/313 R |
| 6,426,583 B1 | * | 7/2002 | Onishi et al. | 310/313 R |

FOREIGN PATENT DOCUMENTS

EP 0 939 485 9/1999

* cited by examiner

Primary Examiner—William P. Watkins, III
Assistant Examiner—Catherine A. Simone
(74) Attorney, Agent, or Firm—Keating & Bennett, LLP (57) ABSTRACT

A surface acoustic wave device includes a SAW element that is mounted on a substrate. Grooves are provided in the substrate at the outer periphery of the SAW element, and a flexible resin layer is provided at the inner portion of the grooves so as to cover the SAW element. An outer resin layer that is harder than the flexible resin layer is provided at the exterior of the flexible resin layer. This configuration facilitates reduction in size and profile of the surface acoustic wave device, contributes to reduction in cost, and exhibits high environmental resistance.

14 Claims, 8 Drawing Sheets

SURFACE ACOUSTIC WAVE DEVICE AND METHOD FOR MAKING THE SAME

BACKGROUND OF THE INVENTION

1. Field of the Invention

The present invention relates to surface acoustic wave devices for use in, for example, resonators, bandpass filters, and other devices, and a method for making the same. More particularly, the present invention relates to a surface acoustic wave device having a structure covered by an outer resin and a method for making the same.

2. Description of the Related Art

Figure 8:
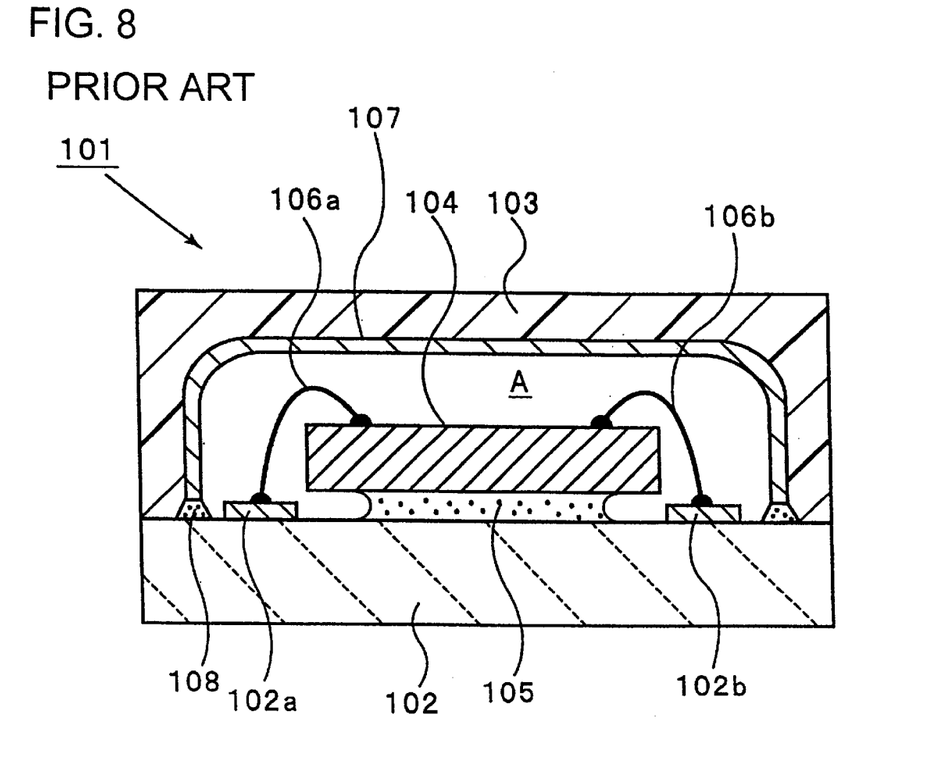
FIG. 8 is a cross-sectional view of a conventional surface acoustic wave device.

FIG. 8 is a cross-sectional view of an exemplary conventional surface acoustic wave device. The surface acoustic wave device 101 has a packaging structure including a substrate 102 and an outer resin layer 103. Electrodes 102a and 102b are provided on the upper surface of the substrate 102 for electrically connecting the surface acoustic wave element 104 to an outer package. A surface acoustic wave element 104 is fixed on the substrate 102 via an insulating adhesive material 105. The surface acoustic wave element 104 is electrically connected to the electrodes 102a and 102b via bonding wires 106a and 106b. A space A must be formed around the surface acoustic wave element 104 to facilitate vibration thereof, and the surface acoustic wave element 104 thereby exhibits satisfactory characteristics. In order to define the space A, the surface acoustic wave element is surrounded by a metal cap 107 having an opening at the bottom. The metal cap 107 is fixed on the substrate 102 via an adhesive 108. Moreover, an outer resin layer 103 is disposed around the metal cap 107 to enhance moisture resistance.

Reductions in size, profile and cost are required for surface acoustic wave devices, as with other electronic components.

In the surface acoustic wave device 101, the package is composed of the substrate 102, the metal cap 107, and the outer resin layer 103. Thus, the package requires many components, which causes an inevitable increase in production cost. Furthermore, after the metal cap 107 is provided to define the space A, the protective layer 109 must be formed by resin molding. This process precludes reductions in size and profile.

SUMMARY OF THE INVENTION

In order to overcome the problems described above, preferred embodiments of the present invention provide a surface acoustic wave device and a method of making the same, which provide a surface acoustic wave device that has a greatly reduced size and profile and that is much less expensive to manufacture.

According to a first preferred embodiment of the present invention, a surface acoustic wave device includes a substrate, a surface acoustic wave element mounted on the substrate, the substrate being provided with at least one first groove provided in the substrate and located at the exterior of the surface acoustic wave element, a flexible resin layer provided on the substrate inside of the first groove so as to cover the surface acoustic wave element, the flexible resin layer being relatively soft, and an outer resin layer provided at the exterior of the flexible resin layer, the outer resin layer being harder than the flexible resin layer.

In this surface acoustic wave device, the package structure includes the substrate, the flexible resin layer, and the outer resin layer. This SAW element packaging structure including these resinous materials facilitates reductions in size and profile of the surface acoustic wave device, whereas conventional surface acoustic wave devices using metal caps for providing spaces preclude reductions in size and profile.

Since the package is completed by forming the resin layers without using a metal cap, the number of components and material cost are reduced and the manufacturing process is simplified. Accordingly, the surface acoustic wave device is produced at low cost.

Since the flexible resin layer provided on the substrate does not extend outside of the first grooves, the flexible resin layer is reliably covered by the outer resin layer, thereby providing a surface acoustic wave device having superior environmental resistance.

Preferably, at least one pair of first grooves opposing each other is provided on the substrate so as to sandwich the surface acoustic wave element.

In such a case, these first grooves are preferably formed at both sides of the SAW element. Thus, the outer resin layer can be formed at both sides of the flexible resin layer, providing a surface acoustic wave device having superior moisture resistance.

The surface acoustic wave device according to another preferred embodiment of the present invention may further include electrodes provided on the substrate for connection with an external component, and bonding wires for electrically connecting the electrodes and the surface acoustic wave element, wherein the surface acoustic wave device is fixed to the substrate.

Alternatively, the surface acoustic wave device may further include electrodes disposed on the substrate for electrical connection with an external component, wherein the surface acoustic wave element is fixed on the substrate by a face down mounting process, and is electrically connected to the electrodes.

That is, the SAW element and the electrodes on the substrate may be bonded with bonding wires or electrically connected by a face down mounting process. Since the bonding wires and the conductive bond are covered with the flexible resin layer in any bonding process, reliability of electrical connection is greatly improved.

Preferably, the surface acoustic wave device may also further include a moisture resistant material layer provided at the exterior of the outer resin layer, the moisture resistant material having higher moisture resistance than that of the outer resin layer.

The moisture resistant material layer contributes to further improvements in environmental properties such as moisture resistance of the resulting surface acoustic wave device.

The surface acoustic wave device may further include another electronic component mounted on the substrate and covered by the outer resin layer.

In such a configuration, reductions in size, profile, and costs of a composite surface acoustic wave device including ICs and other elements are achieved.

According to another preferred embodiment of the present invention, a method for making surface acoustic wave devices includes the steps of preparing a mother substrate having a plurality of first grooves on the upper surface thereof, mounting surface acoustic wave elements onto the mother substrate so that the first grooves are located at the exterior of the surface acoustic wave elements, forming a flexible resin layer of a relatively soft resin on the substrate closer to the surface acoustic wave element than the first grooves so as to cover each surface acoustic wave element, covering the flexible resin layer with an outer resin layer of a relatively hard resin, and cutting the outer resin layer and the mother substrate into individual surface acoustic wave devices.

The method including these simplified steps provides inexpensive surface acoustic wave devices having a greatly reduced size and a greatly reduced profile.

Preferably, the first grooves are at least one pair of first grooves formed at both sides of each surface acoustic wave element.

In such a manner, the outer resin layer is reliably formed at both sides of the flexible resin layer.

Preferably, the method further includes the step of forming second grooves, each extending from the outer resin layer to the mother substrate at outer portions of the first grooves after the formation of the outer resin layer, wherein the mother substrate is cut along the second grooves into the individual surface acoustic wave devices in the cutting step.

The mother substrate is readily cut into surface acoustic wave devices at the second grooves.

Preferably, the method further includes the step of covering the outer resin layer with a moisture resistant material having higher moisture resistance than that of the outer resin layer, this covering step being performed after the step of forming the second grooves and before the step of cutting the mother substrate into the individual surface acoustic wave devices.

Since the outer surface of the outer resin layer is covered by the moisture resistant material layer, the resulting surface acoustic wave device exhibits higher moisture resistance.

Preferably, the mother substrate has third grooves for facilitating cutting at the cutting positions into the individual surface acoustic wave devices on the lower surface thereof.

According to another preferred embodiment of the present invention, a communication device includes the surface acoustic wave device according to the other preferred embodiments of the present invention.

Other features, characteristics, elements and advantages of the present invention will become apparent from the following detailed description of preferred embodiments of the present invention with reference to the attached drawings.

DETAILED DESCRIPTION OF PREFERRED EMBODIMENTS

The present invention is described in detail with reference to the following preferred embodiments.

Figure 1:
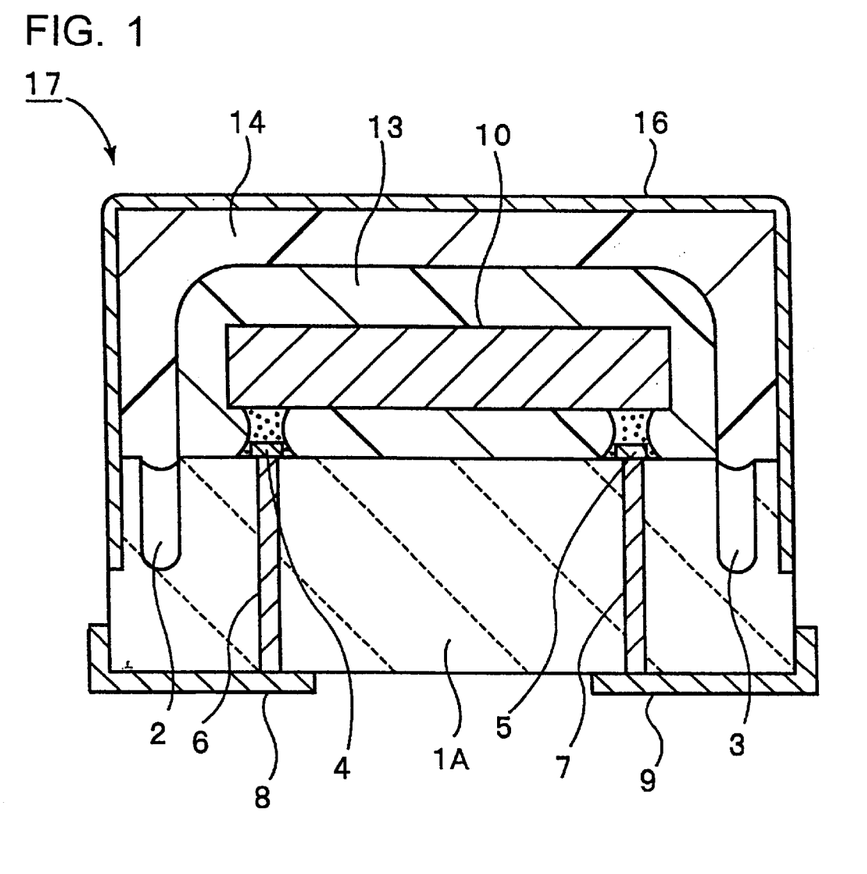
FIG. 1 is a frontal cross-sectional view of a surface acoustic wave device according to a first preferred embodiment of the present invention.

FIG. 1 is a cross-sectional view of a surface acoustic wave device in accordance with a first preferred embodiment of the present invention. FIGS. 2A to 2E are cross-sectional views for illustrating a method for making the surface acoustic wave device of this preferred embodiment of the present invention.

Figure 2A:
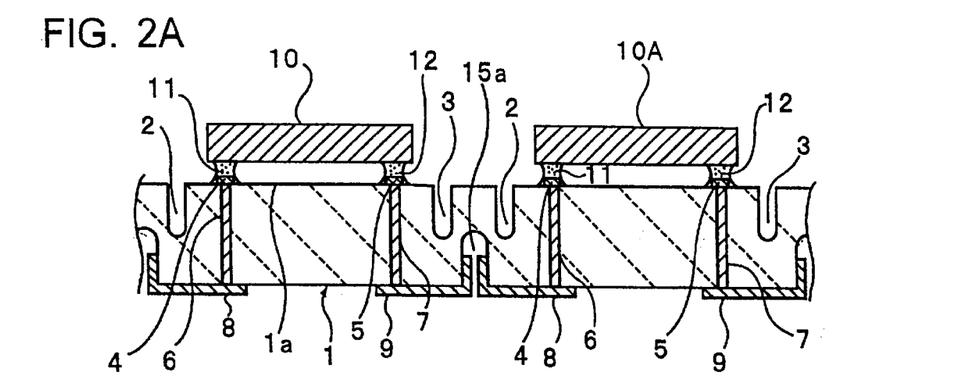
FIG. 2A is a partial frontal cross-sectional view illustrating a state of a surface acoustic wave element mounted on a mother substrate.

With reference to FIG. 2A, a mother substrate 1 is prepared. In this preferred embodiment, the mother substrate 1 is preferably made of alumina. In various preferred embodiments of the present invention, the mother substrate 1 may be made of any insulating material, such as, insulating ceramic, glass-epoxy, or synthetic resin, or other suitable materials.

A plurality of first grooves 2 and 3 is preferably provided on the upper surface 1a of the mother substrate 1, whereas a plurality of third grooves 15a is preferably provided on the lower surface thereof. The third grooves 15a are provided at positions for cutting the mother substrate 1 into individual surface acoustic wave devices. Electrodes 4 and 5 are provided in each region between a pair of first grooves 2 and 3. The electrodes 4 and 5 are electrically connected to through-hole electrodes 6 and 7 that extend from the upper surface to the lower surface of the mother substrate 1. Lower ends of the through hole electrodes 6 and 7 are electrically connected to electrodes 8 and 9, respectively, disposed on the lower surface of the mother substrate 1. Preferably, the electrodes 8 and 9 extend to the third grooves 15a.

The plurality of first grooves 2 and 3 and the third grooves 15a are also preferably provided in the mother substrate 1 in the direction that is substantially parallel to the drawings, respectively, so that the first grooves 2 and 3 define a plurality of substantially rectangular regions which become respective chips.

Surface acoustic wave elements 10 and 10A (hereinafter referred to as SAW elements) are fixed onto the mother substrate 1 preferably via a conductive bond or gold balls 11 and 12 by a face down mounting process in which the SAW element 10 is fixed onto the mother substrate 1 so that a surface provided with electrodes for connection to an external component is facing downwardly. The electrodes of the SAW element 10 are electrically connected to the electrodes 4 and 5 on the mother substrate 1 with conductive bonds 11 and 12, respectively. In addition to fixation of the SAW element 10, electrical connection between the SAW element 10 and the electrodes 4 and 5 is thereby achieved.

The SAW element 10 is fixed in a region between the first grooves 2 and 3. In other words, the SAW element 10 is fixed on the mother substrate 1 so that the first grooves 2 and 3 are located at the exterior of the SAW element.

The electrode structure and arrangement of the other parts of the SAW element 10 are not limited, and well known SAW resonators and SAW filters may be used. The conductive bonds 11 and 12 are also not limited, and may be bonded balls, solder and conductive bonds.

Figure 2B:
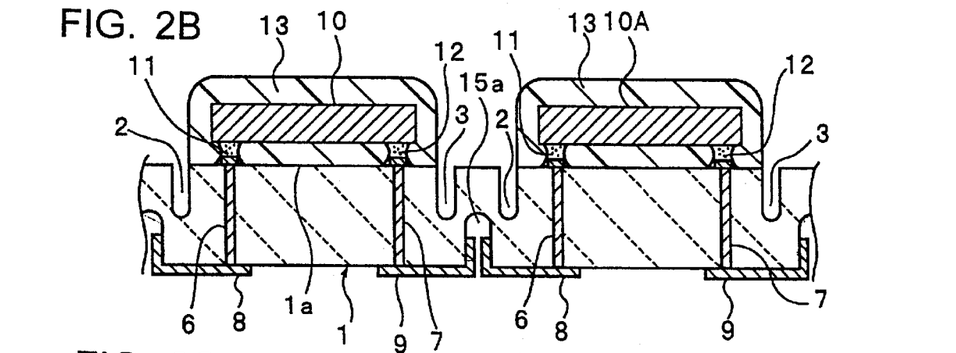
FIG. 2B is a partial frontal cross-sectional view illustrating a state of the formation of a flexible resin layer.

As shown in FIG. 2B, a flexible resin layer 13 is located in a region between the first grooves 2 and 3 on the mother substrate 1 so as to cover the SAW elements 10 and 10A. The flexible resin layer 13 may be a resin having appropriate flexibility that does not adversely affect the properties of the SAW elements 10 and 10A. The flexible resin layer 13 is preferably made of silicon rubber, silicone gel, epoxy gel or the like, and more preferably made of silicone gel or epoxy gel.

In the formation of the flexible resin layer 13, a flexible resin having fluidity is applied so as to cover the SAW element 10 between the first grooves 2 and 3 and is heated to modify the resin. When the first grooves 2 and 3 are narrow, the resin does not extend into the first grooves 2 and 3 due to the surface tension of the flexible resin layer in this preferred embodiment. Even if the flexible resin extends into the first grooves 2 and 3, the resin will not extend to the exteriors of the first grooves 2 and 3.

When the resin constituting the flexible resin layer 13 has low viscosity and low surface tension, the flexible resin is applied so that the flexible resin does not extend to the exteriors of the first grooves 2 and 3 even if the flexible resin reaches the first grooves 2 and 3. In order to define the flexible resin layer 13 having a predetermined shape, it is preferable that the first grooves 2 and 3 are preferably arranged to surround each SAW element. Alternatively, it is preferable that other structures to prevent the flexible resin layer from flowing out of the predetermined area cooperate with the first grooves 2 and 3.

FIGS. 1, 2B and so on show that the flexible resin layer 13 penetrates into a space provided between the mother substrate 1 and the SAW element 10. However, it is not necessary that the flexible resin layer 13 be provided between the mother substrate 1 and the SAW element 10. The space between the mother substrate 1 and the SAW element 10 may be left vacant.

Figure 2C:
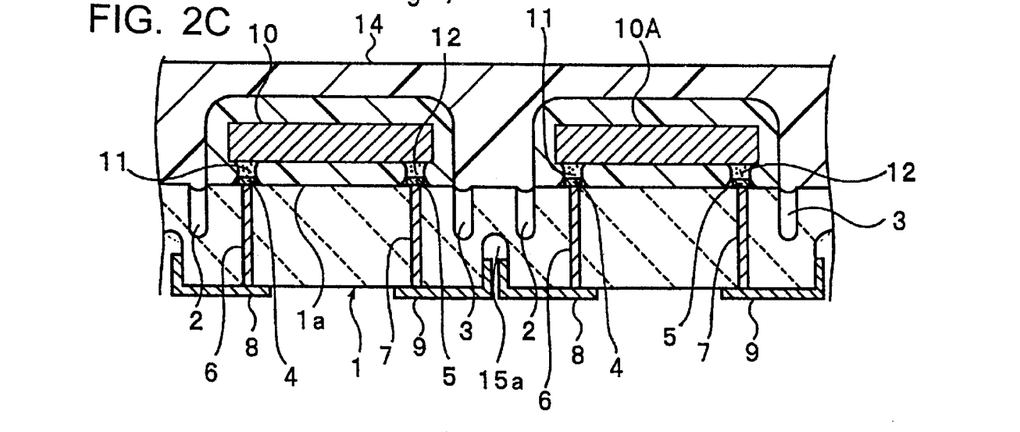
FIG. 2C is a partial frontal cross-sectional view illustrating a state of the formation of an outer resin layer.

With reference to FIG. 2C, then, the upper surface of the mother substrate 1 is covered by an outer resin layer 14. The material for constituting the outer resin layer 14 is preferably an insulating resin that has higher hardness than that of the flexible resin layer 13. Examples of such resins are epoxy resin and glass-epoxy resin.

In this preferred embodiment, the mother substrate 1 provided with the SAW elements 10 and 10A covered by the flexible resin layer 13 is set into a mold. Then, a resin is injected into the mold and is cured therein to form an outer resin layer 14 by resin molding.

Figure 2D:
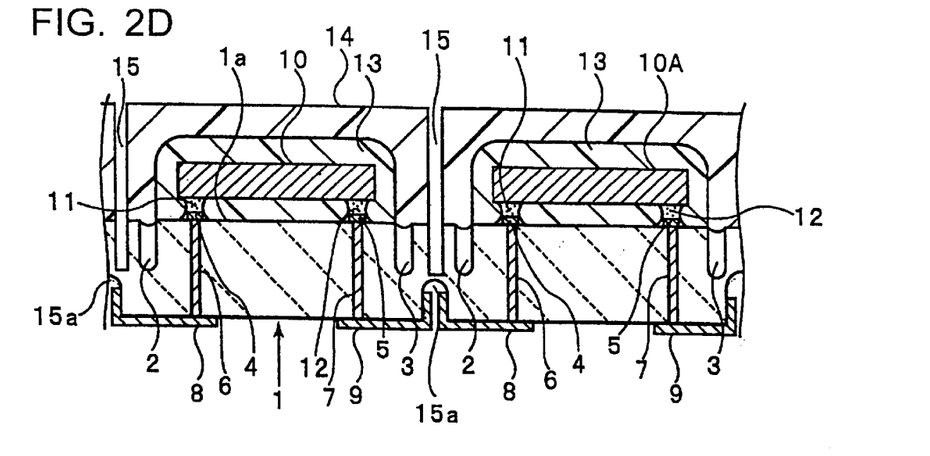
FIG. 2D is a partial frontal cross-sectional view illustrating a state of the formation of second grooves.

As shown in FIG. 2D, a plurality of second grooves 15 is provided above the third grooves 15a from the upper surface of the outer resin layer 14. The second grooves 15 are located outside of the first grooves 2 and 3. These second grooves 15 are used for finally cutting the mother substrate 1 into individual surface acoustic wave devices. Thus, the second grooves 15 are provided at positions for cutting the mother substrate into the individual surface acoustic wave devices. Accordingly, each pair of the second grooves 15 is disposed between a first groove 3 at a SAW element 10 and another first groove 2 at the adjoining SAW element 10A in FIG. 3A. The second grooves 15 pass through the outer resin layer 14 and partly pass through the mother substrate 1.

Figure 2E:
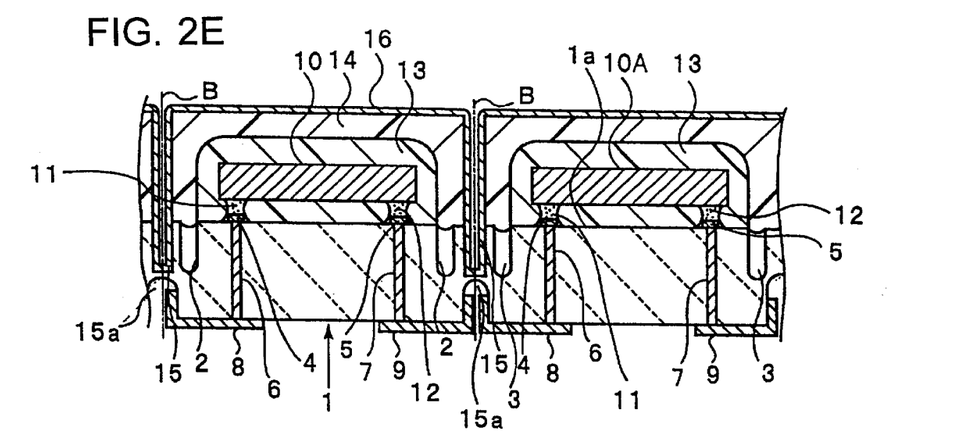
FIG. 2E is a partial frontal cross-sectional view illustrating a state of the formation of a moisture resistant resin layer.

Next, as shown in FIG. 2E, a moisture resistant material layer 16 is provided on the outer resin layer 14. The moisture resistant material layer 16 may be made of a material that exhibits higher moisture resistance than that of the resin constituting the outer resin layer 14. Examples of such materials are moisture resistant resins, e.g., polyimide resin, and inorganic materials, e.g., $SiO_2$ and metal.

When the moisture resistant material is applied to form the moisture resistant material layer 16, it is preferable that the moisture resistant material extends into the second grooves 15. That is, the material is applied so that the moisture resistant material layer 16 extends to a level that is lower than the interface between the outer resin layer 14 and the mother substrate 1 so as to cover the entire outer surfaces of the outer resin layer 14.

Next, the mother substrate 1 is cut along dotted lines B shown in FIG. 2E. In other words, the mother substrate 1 is cut along the center of the second grooves 15 to prepare a surface acoustic wave device 17 in this preferred embodiment. It is to be noted that the cutting is also performed along the approximate center of the second grooves 15 arranged substantially parallel to the FIG. 2E. The cutting method is not limited and may use a dicer, a laser, or a slicer, or other suitable cutting device or method. The third grooves 15a that are provided below the second grooves 15 facilitate separation of the SAW elements 10 and 10A. However, there is no difference in electrical properties if the third grooves 15a are not provided.

As shown in FIG. 1, in the surface acoustic wave device 17, the SAW element 10 is fixed on the substrate 1A, which is prepared by cutting the mother substrate 1. The SAW element 10 is preferably surrounded by the flexible resin layer 13. Moreover, the outer surfaces of the flexible resin layer 13 are preferably surrounded by the outer resin layer 14, and the moisture resistant material layer 16 covers the outer surfaces of the outer resin layer 14. Thus, the resulting surface acoustic wave device 17 exhibits superior environmental resistance, such as moisture resistance.

Moreover, the packaging structure is provided on the substrate 1A by forming the flexible resin layer 13, the outer resin layer 14, and the moisture resistant material layer 16 by the application and curing processes. Thus, the number of the components and the material cost are greatly reduced compared with conventional methods using metal caps.

Figure 3A:
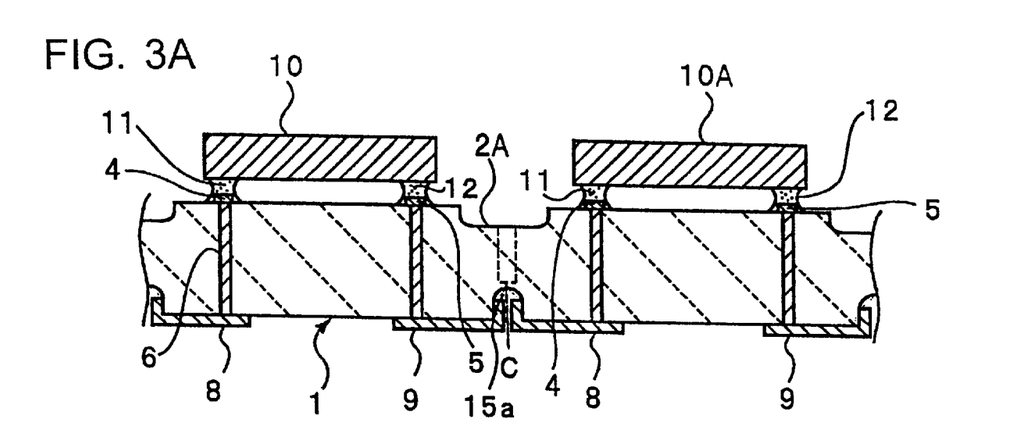
FIG. 3A is a partial frontal cross-sectional view illustrating a method for making a surface acoustic wave device of a second preferred embodiment of the present invention.
Figure 3B:
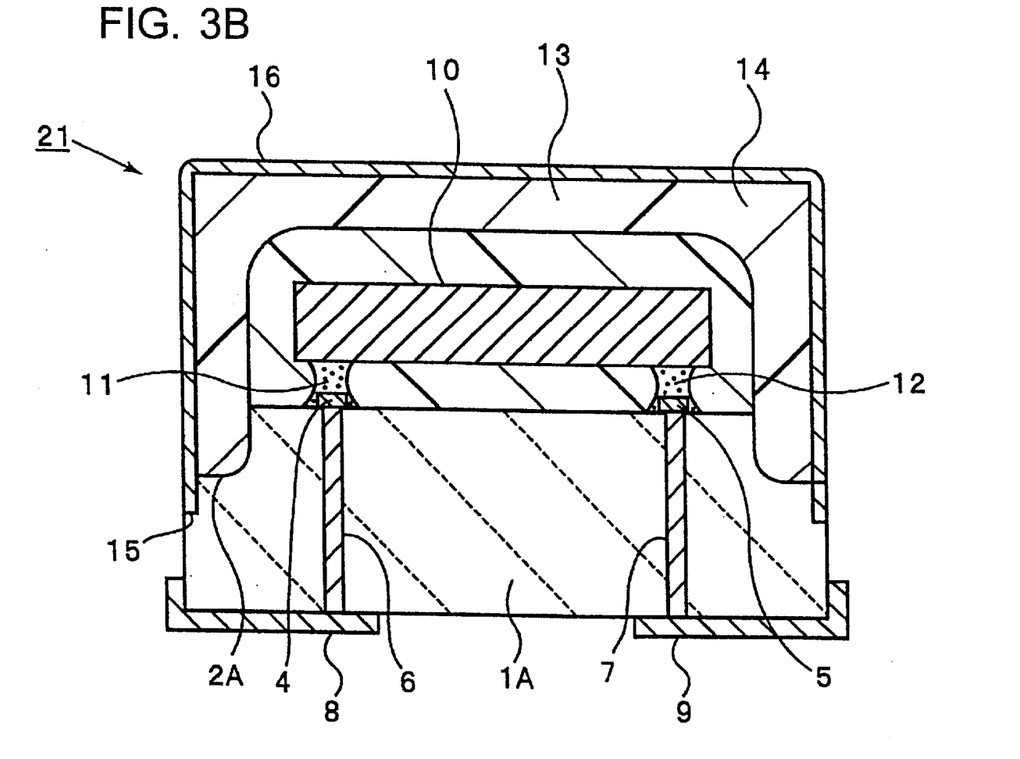
FIG. 3B is a partial frontal cross-sectional view illustrating the surface acoustic wave device in accordance with the second preferred embodiment.

FIGS. 3A and 3B are cross-sectional views illustrating another preferred embodiment of the method for making the surface acoustic wave device of the present invention. In this preferred embodiment, a wide groove 2A is formed between the two adjoining SAW elements 10 and 10A, instead of the narrow first grooves 2 and 3 in the preferred embodiment described above. When a flexible resin layer is formed in this case, a resin constituting the flexible resin layer is also applied so that the SAW element 10 is covered by the resin at the inner side of the wide grooves 2A. After an outer resin layer, second grooves, and a moisture resistant resin layer are formed as in the first preferred embodiment, the substrate is cut along the second grooves. In this case, the second grooves are formed in the approximate center of the wide groove 2A in the width direction, as shown by a broken line in FIG. 3A.

Figure 4A:
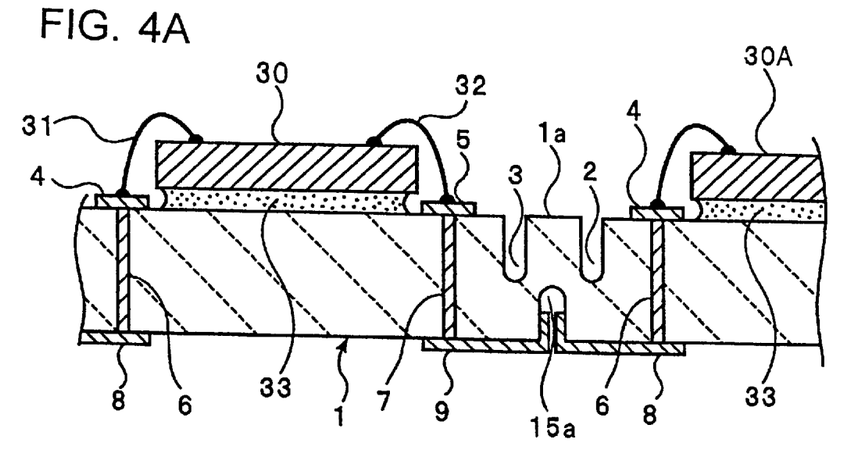
FIG. 4A is a partial frontal cross-sectional view illustrating a method for making a surface acoustic wave device of a third preferred embodiment of the present invention.
Figure 4B:
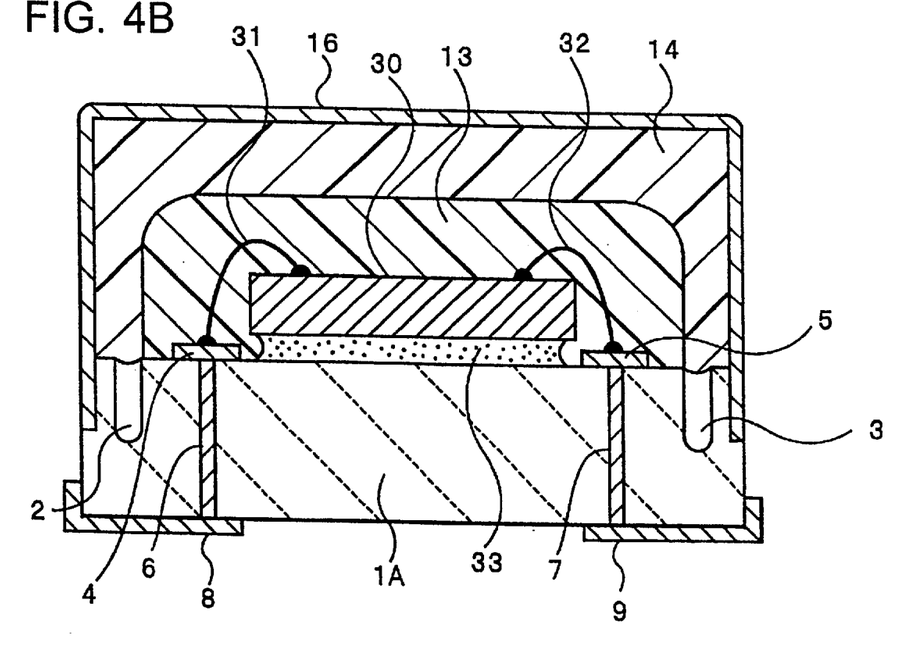
FIG. 4B is a partial frontal cross-sectional view illustrating the surface acoustic wave device in accordance with the third preferred embodiment.

A surface acoustic wave device 21 shown in FIG. 4B is thereby prepared. In the second preferred embodiment, the flexible resin layer 13 is formed in an inner region between the wide grooves 2A. Thus, the resulting surface acoustic wave device 21 is compact and inexpensive and exhibits superior environmental resistance, as in the first preferred embodiment.

FIGS. 4A and 4B are cross-sectional views illustrating a method for making the surface acoustic wave device in accordance with yet another preferred embodiment of the present invention.

In the third preferred embodiment, SAW elements 30 and 30A are electrically connected to electrodes 4 and 5, respectively, provided on a mother substrate 1 with bonding wires 31 and 32, respectively. That is, the SAW elements 30 and 30A are fixed on the mother substrate 1 preferably via an insulating bond 33. The other steps are substantially the same as those in the first preferred embodiment. Thus, a surface acoustic wave device 33 shown in FIG. 4B is prepared by the steps shown in the first preferred embodiment.

As described above, in various preferred embodiments of the present invention, fixation of the SAW element to the substrate and electrical connection of the SAW element to the electrodes 4 and 5 on the substrate may be performed by a process using the bonding wires 31 and 32, instead of the face down mounting process.

Figure 5A:
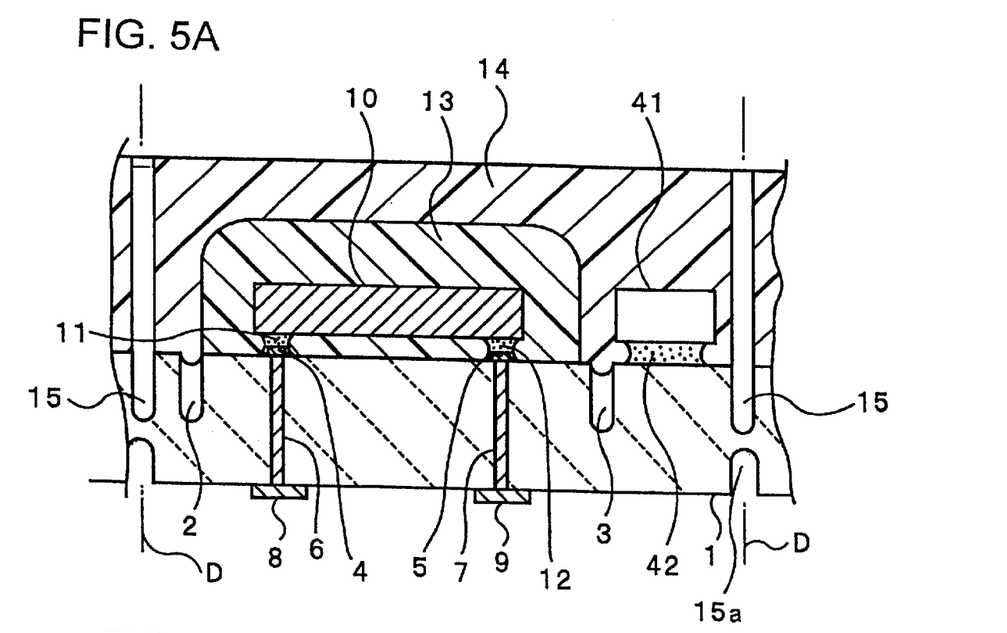
FIGS. 5A and 5B are partial frontal cross-sectional views illustrating steps of producing surface acoustic wave devices of a fourth preferred embodiment and a modification thereof, respectively, of the present invention.
Figure 5B:
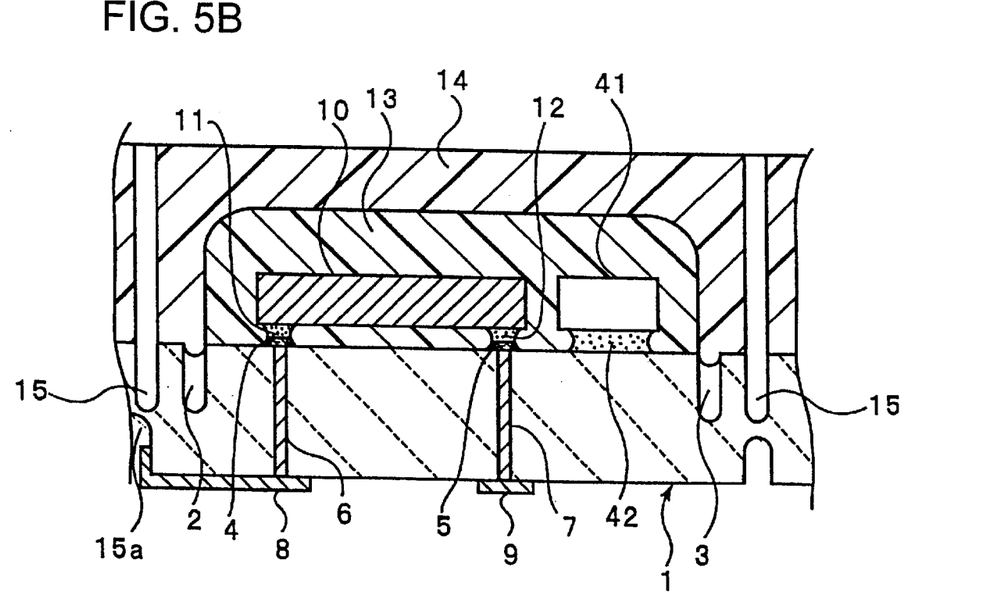

FIGS. 5A and 5B are fragmental front cross-sectional views illustrating a method for making the surface acoustic wave device in accordance with a further preferred embodiment of the present invention.

In the present preferred embodiment, an IC 41 defining another electronic component, in addition to the SAW element 10, is fixed on the mother substrate 1 with an insulating bond 42. Chain lines D in FIG. 5A represent cutting positions when the mother substrate is cut into individual surface acoustic wave devices are finally prepared. Thus, in this preferred embodiment, the resulting surface acoustic wave device is a composite-type electronic component including the SAW element 10 and the IC 41. In this case, the IC 41 is arranged at the outer region of the first groove 3 and in an inner region between the second grooves 15 which are cutting positions. Thus, the IC 41 is not covered by the flexible resin layer 13 but covered by the outer resin layer 14.

As shown in FIG. 5B, the IC 41 may be arranged at an inner region than the first groove 3 so that the IC 41 is also covered by the flexible resin layer 13. In this case, the IC 41 is covered by the outer resin layer 14 with the flexible resin layer 13 provided therebetween.

The IC 41 is exemplified as another electronic component in the present preferred embodiment. Alternatively, the IC may be replaced with any other electronic component, such as a capacitor or a resistor.

Moreover, electrical connection between the IC 41 and the SAW element 10 and electrical connection between the IC 41 and the external component may be performed by providing through hole electrodes in the mother substrate 1 or providing lead electrodes on both surfaces or the lower surface of the mother substrate 1.

Figure 6:
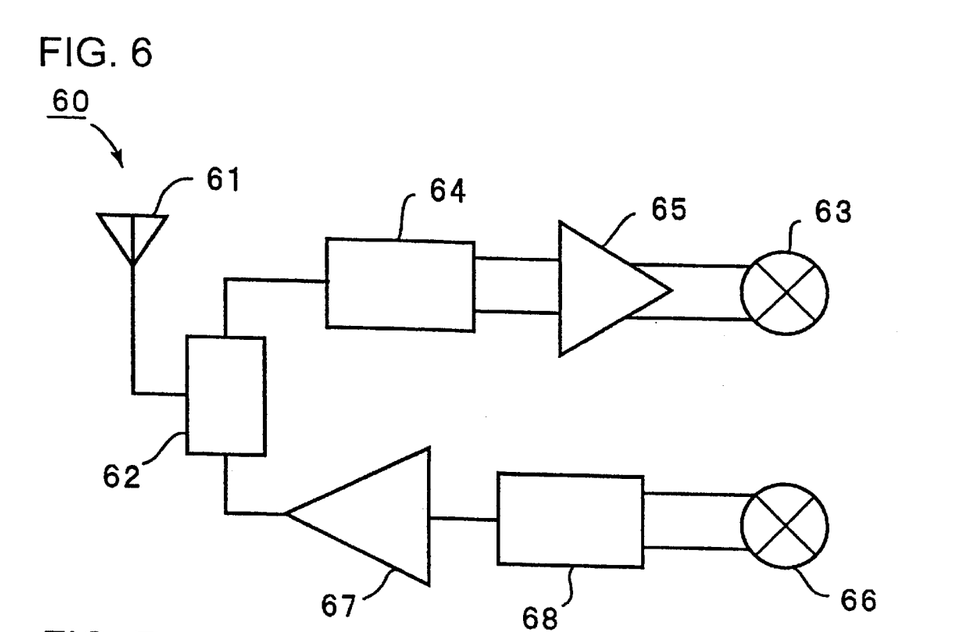
FIG. 6 is an outline block diagram of a preferred embodiment of a communication device including a surface acoustic wave device according to other preferred embodiments of the present invention.
Figure 7:
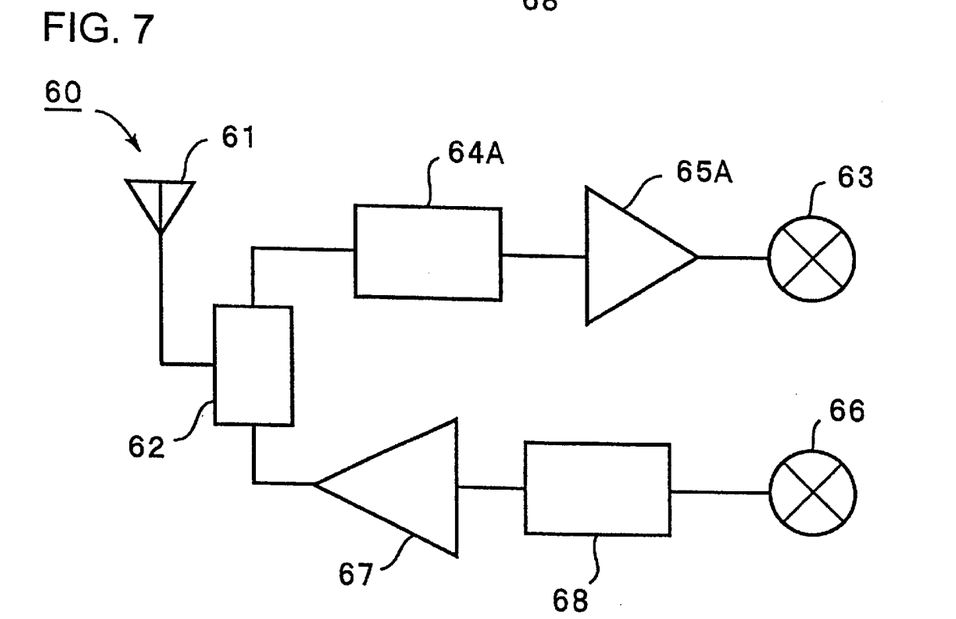
FIG. 7 is an outline block diagram of another preferred embodiment of a communication device including a surface acoustic wave filter according to other preferred embodiments of the present invention.

FIGS. 6 and 7 are outline block diagrams of communication devices 60 using surface acoustic wave filters in accordance with various preferred embodiments of the present invention.

In FIG. 6, a duplexer 62 is connected to an antenna 61. A surface acoustic wave filter 64 and an amplifier 65 are connected between the duplexer 62 and a receiving mixer 63. An amplifier 67 and a surface acoustic wave filter 68 are connected to the duplexer 62 and a transmitter mixer 66.

As shown in FIG. 7, when an amplifier 65A used in the transmitter side corresponds to unbalanced signals, the surface acoustic wave filter in accordance with various preferred embodiments of the present invention can be preferably used as a surface acoustic wave filter 64A.

While the present invention has been particularly shown and described with reference to preferred embodiments thereof, it will be understood by those skilled in the art that the foregoing and other changes in form and details can be made without departing from the spirit and scope of the invention.

What is claimed is:

1. A surface acoustic wave device comprising:
   a substrate;
   a surface acoustic wave element mounted on the substrate, the substrate being provided with at least one first groove;
   an inner resin layer provided on the substrate surrounding the surface acoustic wave element and adjacent to the at least one first groove so as to cover the surface acoustic wave element; and
   an outer resin layer provided at the exterior of the inner resin layer, the outer resin layer being harder than the inner resin layer.

2. A surface acoustic wave device according to claim 1, further comprising at least a pair of first grooves opposing each other on the substrate so as to sandwich the surface acoustic wave element.

3. A surface acoustic wave device according to claim 1, further comprising a plurality of second grooves arranged with the at least one first groove to define a substantially rectangular region in which the surface acoustic wave element is located.

4. A surface acoustic wave device according to claim 1, further comprising electrodes arranged on the substrate so as to achieve connection with an external component, and bonding wires arranged to electrically connect the electrodes and the surface acoustic wave element, wherein the surface acoustic wave device is fixed to the substrate.

5. A surface acoustic wave device according to claim 1, further comprising electrodes arranged on the substrate to achieve electrical connection with an external component, wherein the surface acoustic wave element is fixed on the substrate in a face down arrangement, and is electrically connected to the electrodes.

6. A surface acoustic wave device according to claim 1, further comprising a moisture resistant material layer provided at the exterior of the outer resin layer, the moisture resistant material having higher moisture resistance than that of the outer resin layer.

7. A surface acoustic wave device according to claim 1, further comprising another electronic component mounted on the substrate and covered by the outer resin layer.

8. A surface acoustic wave device according to claim 7, wherein the another electronic component is an integrated circuit component and is not covered by the inner resin layer.

9. A surface acoustic wave device according to claim 1, wherein the substrate is made of one of alumina, insulating ceramic, glass-epoxy, and synthetic resin.

10. A surface acoustic wave device according to claim 1, wherein the inner resin layer does not extend into the at least one first groove.

11. A surface acoustic wave device according to claim 1, wherein the inner resin layer extends within but not beyond the at least one first groove.

12. A surface acoustic wave device according to claim 1, wherein the inner resin layer penetrates into a space provided between the substrate and the surface acoustic wave element.

13. A surface acoustic wave device according to claim 1, wherein the inner resin layer is made of either silicone gel or epoxy gel.

14. A surface acoustic wave device according to claim 1, wherein the at least one first groove is located on the substrate in the region exterior to the space provided between the substrate and the SAW element.

* * * * *